United States Patent
Shiraiwa et al.

(10) Patent No.: US 10,147,628 B2
(45) Date of Patent: Dec. 4, 2018

(54) ELECTROSTATIC CHUCK AND SEMICONDUCTOR-LIQUID CRYSTAL MANUFACTURING APPARATUS

(71) Applicant: SHINKO ELECTRIC INDUSTRIES CO., LTD., Nagano-shi (JP)

(72) Inventors: Norio Shiraiwa, Nagano (JP); Jiro Kawai, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 489 days.

(21) Appl. No.: 14/718,640

(22) Filed: May 21, 2015

(65) Prior Publication Data

US 2015/0348814 A1 Dec. 3, 2015

(30) Foreign Application Priority Data

May 28, 2014 (JP) ................................. 2014-109931

(51) Int. Cl.
*H01L 21/683* (2006.01)
*H01J 37/32* (2006.01)

(52) U.S. Cl.
CPC .... *H01L 21/6833* (2013.01); *H01J 37/32715* (2013.01)

(58) Field of Classification Search
None
See application file for complete search history.

(56) References Cited

U.S. PATENT DOCUMENTS

| 8,092,638 B2 * | 1/2012 | Brillhart | H01L 21/67109 156/345.24 |
| 8,274,640 B2 * | 9/2012 | Kalkowski | H01L 21/6831 355/72 |
| 2008/0080118 A1 * | 4/2008 | Shiraiwa | H01L 21/6831 361/234 |

(Continued)

FOREIGN PATENT DOCUMENTS

| JP | 2003115529 A | * | 4/2003 |
| JP | 2008-47657 A1 | | 2/2008 |

(Continued)

OTHER PUBLICATIONS

Machine Generated English Translation of KR 10-2012-0113185. Published Oct. 12, 2012/.*

(Continued)

*Primary Examiner* — Sylvia MacArthur
(74) *Attorney, Agent, or Firm* — Kratz, Quintos & Hanson, LLP

(57) ABSTRACT

An electrostatic chuck includes a base plate including a penetration hole, a cylindrical insulating component inserted in the penetration hole, the cylindrical insulating component including a protruding portion protruding from an upper end of the penetration hole, a placing table arranged on the base plate, a dent portion formed in a lower face of the placing table, the dent portion in which the protruding portion of the cylindrical insulating component is fitted, a concave portion formed in the dent portion of the placing table, an electrode formed in the concave portion of the placing table, and a power feeding terminal arranged in an inner part of the cylindrical insulating component, the power feeding terminal connected to the electrode.

7 Claims, 26 Drawing Sheets

(56) References Cited

U.S. PATENT DOCUMENTS

| | | | | |
|---|---|---|---|---|
| 2013/0180662 A1* | 7/2013 | Sato | .................. | H01J 37/32082 |
| | | | | 156/345.51 |
| 2013/0286531 A1* | 10/2013 | Shiraiwa | ............. | H01L 21/6833 |
| | | | | 361/234 |
| 2015/0340261 A1* | 11/2015 | Katayama | ............. | G02F 1/1303 |
| | | | | 269/8 |
| 2015/0348814 A1* | 12/2015 | Shiraiwa | ........... | H01J 37/32715 |
| | | | | 156/345.51 |

FOREIGN PATENT DOCUMENTS

| | | | |
|---|---|---|---|
| JP | 2008098513 A | * | 4/2008 |
| JP | 2013-229464 A1 | | 11/2013 |

OTHER PUBLICATIONS

Machine Generated English Translation of JP2003-115529A. Published Apr. 18, 2003.*
Machine Generated English Translation of JP2008-098513. Published Apr. 24, 2008.*
Machine Generated English Translation of JP 2008-98513A published Apr. 2008.*
Japanese Office Action for counterpart Japanese Patent Application No. 2014-109931 dated Oct. 24, 2017 (3 Sheets, 3 Sheets translation, 6 Sheets total).

* cited by examiner

ELECTROSTATIC CHUCK AND SEMICONDUCTOR-LIQUID CRYSTAL MANUFACTURING APPARATUS

CROSS-REFERENCE TO RELATED APPLICATIONS

This application is based upon and claims the benefit of priority of the prior Japanese Patent Application No. 2014-109931, filed on May 28, 2014, the entire contents of which are incorporated herein by reference.

FIELD

This invention is related to an electrostatic chuck to be used as a mechanism for attracting a wafer or the like, and to a semiconductor-liquid crystal manufacturing apparatus including the same.

BACKGROUND ART

In the prior art, semiconductor manufacturing apparatus such as dry etching apparatus used for semiconductor wafer processing or the like is provided with an electrostatic chuck for placing and electrostatically attracting a wafer in order to control temperature of the wafer during the wafer processing.

A related art is disclosed in Japanese Laid-open Patent Publication No. 2008-47657 and Japanese Laid-open Patent Publication No. 2013-229464.

As will be explained in the preliminary matter section below, a placing table of an electrostatic chuck is formed of ceramic. Therefore, a positional accuracy of a concave portion where an electrode is arranged cannot be sufficiently ensured.

For this reason, if the concave portion of the placing table is arranged to be shifted from a center of a penetration hole in a base plate, a distance between a power feeding terminal or the electrode of the placing table and the base plate is short, thus there is a problem in which electric discharge may be easily generated.

SUMMARY

According to one aspect discussed herein, there is provided an electrostatic chuck, including a base plate including a penetration hole, a cylindrical insulating component inserted in the penetration hole, the cylindrical insulating component including a protruding portion protruding from an upper end of the penetration hole, a placing table arranged on the base plate, a dent portion formed in a lower face of the placing table, the dent portion in which the protruding portion of the cylindrical insulating component is fitted, a concave portion formed in the dent portion of the placing table, an electrode formed in the concave portion of the placing table, and a power feeding terminal arranged in an inner part of the cylindrical insulating component, the power feeding terminal connected to the electrode.

Also, according to another aspect discussed herein, there is provided a semiconductor-liquid crystal manufacturing apparatus, including a chamber, and an electrostatic chuck attached to the chamber, wherein the electrostatic chuck includes, a base plate including a penetration hole, a cylindrical insulating component inserted in the penetration hole, the cylindrical insulating component including a protruding portion protruding from an upper end of the penetration hole, a placing table arranged on the base plate, a dent portion formed in a lower face of the placing table, the dent portion in which the protruding portion of the cylindrical insulating component is fitted, a concave portion formed in the dent portion of the placing table, an electrode formed in the concave portion of the placing table, and a power feeding terminal arranged in an inner part of the cylindrical insulating component, the power feeding terminal connected to the electrode.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

DESCRIPTION OF EMBODIMENTS

Hereinbelow, an embodiment of the present invention will be explained with reference to the accompanying drawings.

Prior to the explanation of an embodiment, the preliminary matter to be set forth as a basis will be explained hereunder. An electrostatic chuck according to the preliminary matter is the basis of an electrostatic chuck of the present invention, and is not a known art.

First, a problem in a first electrostatic chuck of a type in which a power feeding terminal is soldered to a connection electrode of a placing table will be explained.

Figure 1A:
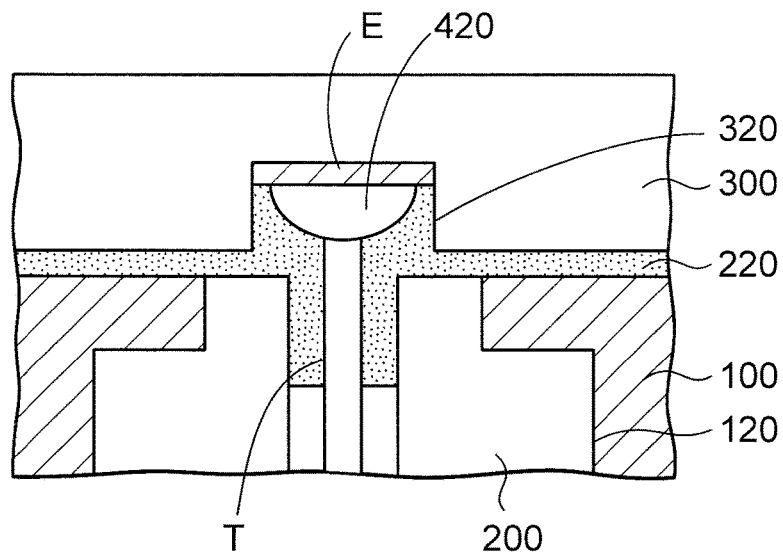
FIGS. 1A and 1B are partial cross-sectional views depicting a state of a power feeding portion of an electrostatic chuck according to a preliminary matter (part 1).

As depicted in FIG. 1A, the first electrostatic chuck includes a base plate 100, and a penetration hole 120 is formed in the base plate 100. A cylindrical insulating component 200 is arranged inside the penetration hole 120 of the base plate 100.

Further, a placing table 300 is bonded to upper sides of the base plate 100 and the cylindrical insulating component 200 by an adhesive layer 220. A concave portion 320 is formed in a lower face of the placing table 300 over a region including a hollow portion of the cylindrical insulating component 200.

The placing table 300 includes a connection electrode E on a bottom face of the concave portion 320, and the connection electrode E is connected to an electrostatic electrode (not depicted) formed in an inner part of the placing table 300.

Moreover, a power feeding terminal T is inserted in the concave portion 320 of the placing table 300 through the inside of the cylindrical insulating component 200, and the power feeding terminal T is bonded to the connection electrode E of the placing table 300 by a solder layer 420.

In this way, voltage is applied from the power feeding terminal T to the electrostatic electrode (not depicted) connected to the connection electrode E.

The placing table 300 is formed of ceramic. As a method of making the placing table 300, a method is employed which includes, forming tungsten paste which will be a conductive layer such as the connection electrode E, in a surface and a penetration hole of a green sheet, laminating a plurality of green sheets, and sintering them.

Figure 1B:
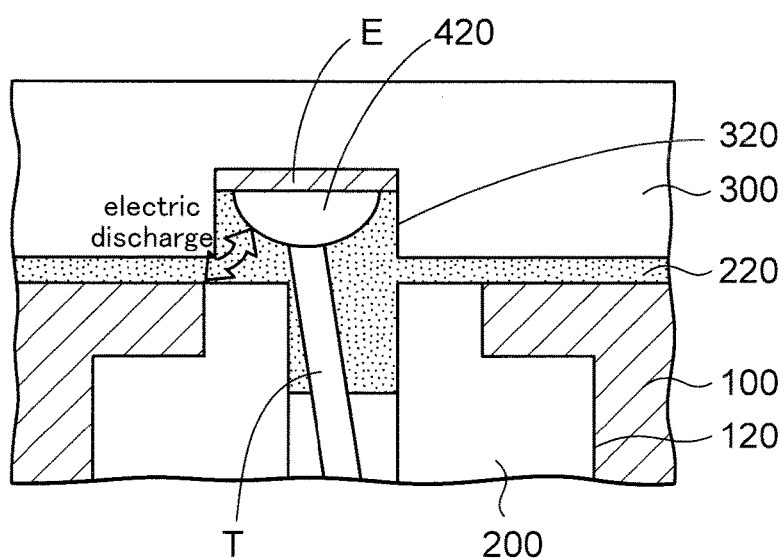

When the green sheets are sintered and the ceramic is formed, since shrinkage is generated, there is a problem in which sufficiently high positional accuracy cannot be ensured. For this reason, as depicted in FIG. 1B, the concave portion 320 of the placing table 300 may sometimes be arranged to be considerably shifted from the center of the penetration hole 120 of the base plate 100.

In this state, the distance between the bonding part of the power feeding terminal T and the base plate 100 is short too much, thus it is difficult to sufficiently insulate both with only the adhesive layer 220. For this reason, electric discharge is generated between the bonding part of the power feeding terminal T and the base plate 100, and voltage cannot be properly applied to the connection electrode E. Therefore, it cannot function as the electrostatic chuck.

Next, a problem in a second electrostatic chuck of a type in which a power feeding terminal touches a connection electrode of a placing table by using elastic force will be explained.

Figure 2A:
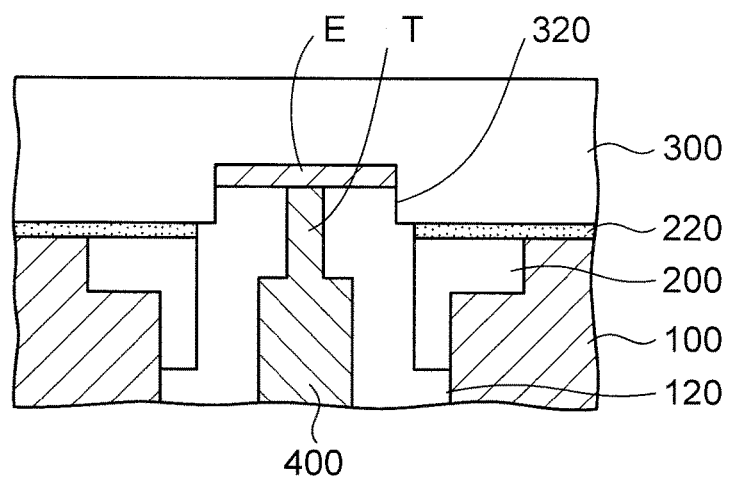
FIGS. 2A and 2B are partial cross-sectional views depicting a state of the power feeding portion of other electrostatic chuck according to the preliminary matter (part 2).

As depicted in FIG. 2A, in the second electrostatic chuck, similarly to FIG. 1A, a cylindrical insulating component 200 is arranged in an upper end side of the inside of a penetration hole 120 of a base plate 100. Also similarly, a placing table 300 is bonded to upper sides of the base plate 100 and the cylindrical insulating component 200 by an adhesive layer 220. Also similarly, a connection electrode E is formed on a bottom face of a concave portion 320 of the placing table 300.

Then, a connector 400 including a power feeding terminal T is arranged in the penetration hole 120 of the base plate 100. The power feeding terminal T is inserted in the concave portion 320 of the placing table 300 through the inside of the cylindrical insulating component 200, and the power feeding terminal T touches the connection electrode E of the placing table 300.

The power feeding terminal T is coupled to a spring (not depicted) inside the connector 400 and presses the connection electrode E by the elastic force of the spring.

In this way, voltage is applied from the power feeding terminal T to an electrostatic electrode (not depicted) connected to the connection electrode E.

Figure 2B:
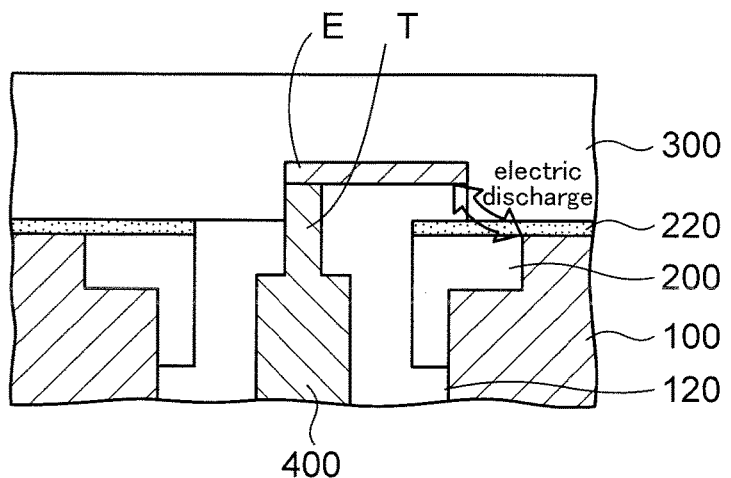

FIG. 2B depicts a state in which the position of the concave portion 320 of the placing table 300 is arranged to shift from the center of the penetration hole 120 of the base plate 100, similarly to FIG. 1B mentioned above. In this case, the distance between the connection electrode E of the placing table 300 and the base plate 100 is short too much, thus it is difficult to sufficiently insulate both with only the adhesive layer 220.

For this reason, electric discharge is generated between the connection electrode E of the placing table 300 and the base plate 100, and voltage cannot be properly applied to the connection electrode E. Therefore, it cannot function as the electrostatic chuck.

Electrostatic chucks of embodiments to be explained below can solve the problems described above.

(First Embodiment)

Figure 16:
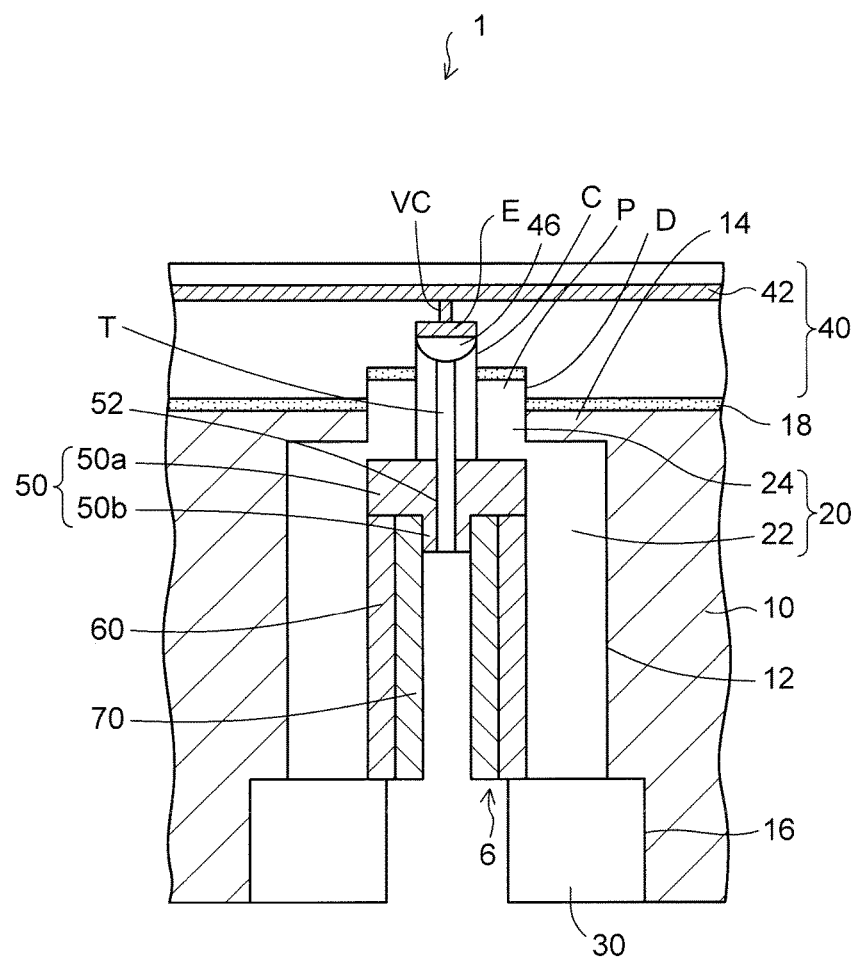
FIG. 16 is a cross-sectional view depicting an electrostatic chuck according to the first embodiment (part 1).
Figure 17:
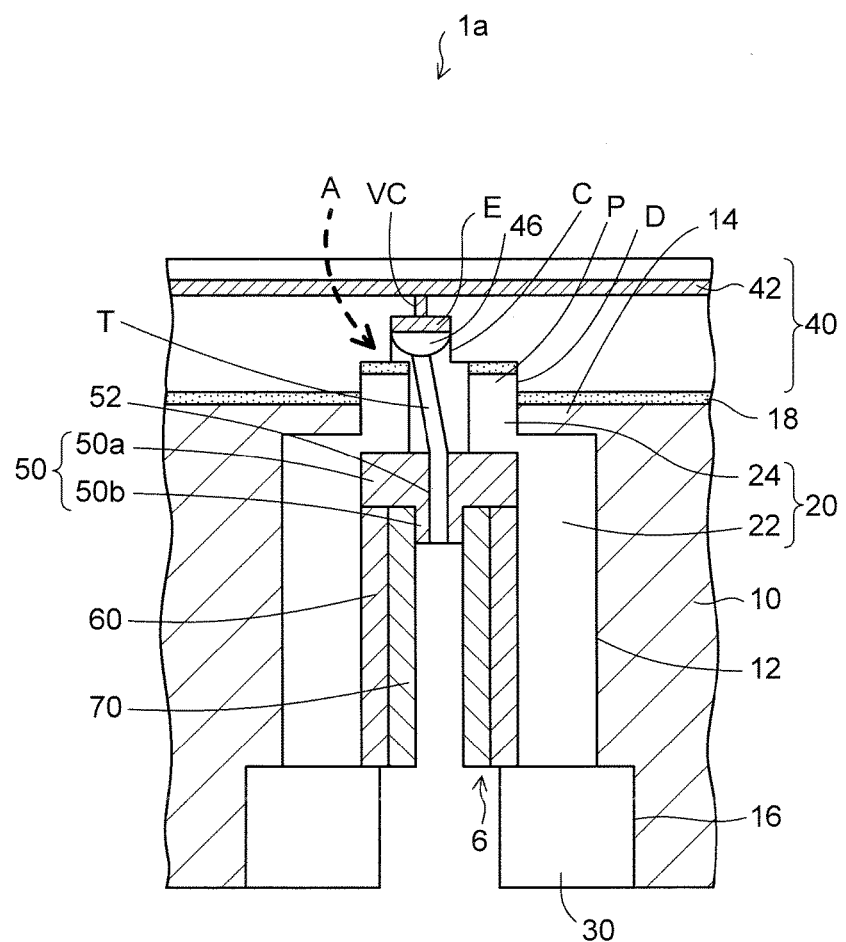
FIG. 17 is a cross-sectional view depicting an electrostatic chuck according to the first embodiment (part 2).

FIG. 3 to FIG. 15 are views depicting a method of manufacturing an electrostatic chuck of a first embodiment. FIG. 16 and FIG. 17 are views depicting electrostatic chucks of the first embodiment. In the first embodiment, while explaining the method of manufacturing an electrostatic chuck, the structure of the electrostatic chuck will be explained.

The first embodiment will be explained by enumerating, as an example, an electrostatic chuck of a type in which a power feeding terminal is bonded to a connection electrode of a placing table by a solder layer.

Figure 3:
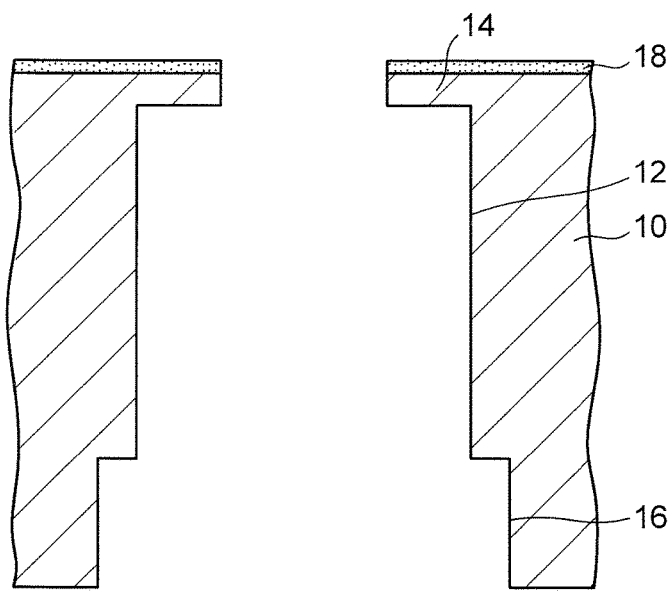
FIG. 3 is a cross-sectional view depicting a method of manufacturing an electrostatic chuck according to a first embodiment (part 1).

As depicted in FIG. 3, in the method of manufacturing an electrostatic chuck of the first embodiment, first, a base plate 10 made of a metal such as aluminum is prepared. FIG. 3 partially depicts the base plate 10 in a power feeding part of the electrostatic chuck. The base plate 10 is actually formed in a circular disk shape.

The base plate 10 includes a penetration hole 12 penetrating in the thickness direction thereof. Further, a protruding portion 14 having an annular shape and including an inner wall protruding inward is formed in an upper end side of the inside of the penetration hole 12 of the base plate 10. Furthermore, a level difference portion 16 having an annular shape and including an inner wall receding outward is formed in an lower end side of the inside of the penetration hole 12 of the base plate 10.

Then, a silicone resin-based adhesive layer 18 is formed on an upper face of the base plate 10 by using a screen mask.

Figure 4:
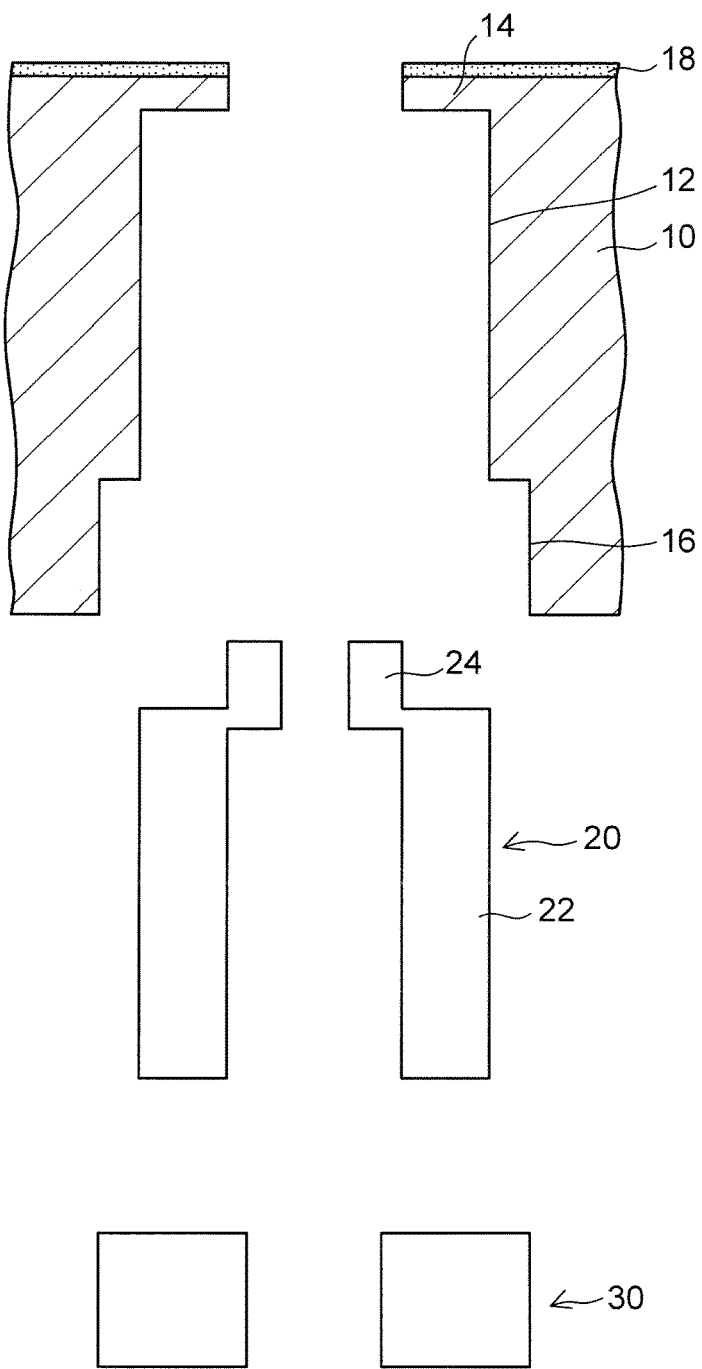
FIG. 4 is a cross-sectional view depicting the method of manufacturing an electrostatic chuck according to the first embodiment (part 2).

Thereafter, as depicted in FIG. 4, a first cylindrical insulating component 20 is prepared. The first cylindrical insulating component 20 is formed of an insulating resin material such as PEEK (Polyether ether ketone) resin or polyetherimide resin (Ultem resin).

The first cylindrical insulating component 20 includes a first cylindrical portion 22 and a second cylindrical portion 24 thereon. The outer diameter and the inner diameter of the second cylindrical portion 24 are set to be smaller than the outer diameter and the inner diameter of the first cylindrical portion 22.

The outer diameter of the first cylindrical portion 22 of the first cylindrical insulating component 20 corresponds to the inner diameter of a center part of the penetration hole 12 of the base plate 10. Moreover, the outer diameter of the second cylindrical portion 24 of the first cylindrical insulating component 20 corresponds to the inner diameter of the protruding portion 14 of the base plate 10.

Further, a second cylindrical insulating component 30 is prepared. The outer diameter of the second cylindrical insulating component 30 corresponds to the inner diameter of the level difference portion 16 of the base plate 10. The second cylindrical insulating component 30 is formed of the same insulating resin material as the first cylindrical insulating component 20.

Figure 5:
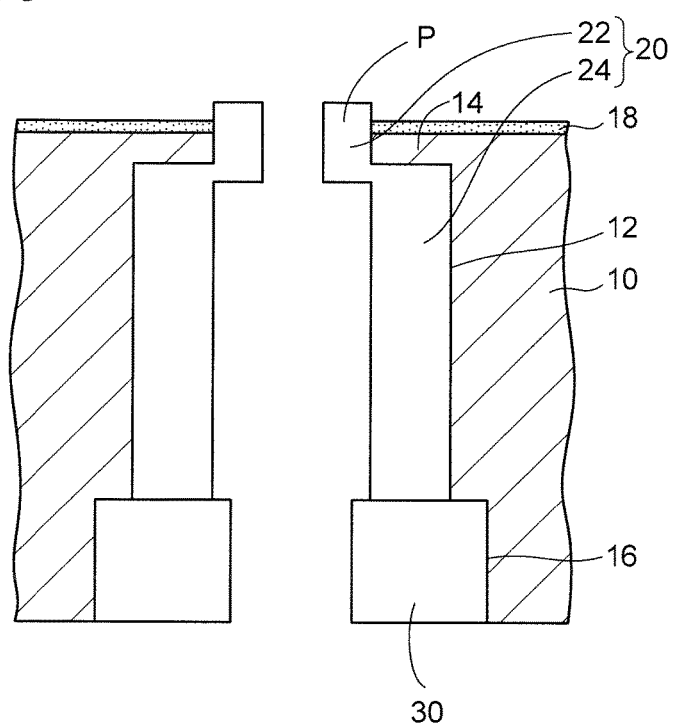
FIG. 5 is a cross-sectional view depicting the method of manufacturing an electrostatic chuck according to the first embodiment (part 3).

Then, as depicted in FIG. 5, the first cylindrical insulating component 20 is inserted into the penetration hole 12 of the base plate 10. At this time, an upper end side of the second cylindrical portion 24 of the first cylindrical insulating component 20 becomes a protruding portion P protruding from an upper end of the penetration hole 12 of the base plate 10. Further, the second cylindrical insulating component 30 is screwed into the level difference portion 16 of the base plate 10 and is fixed to it.

Figure 6A:
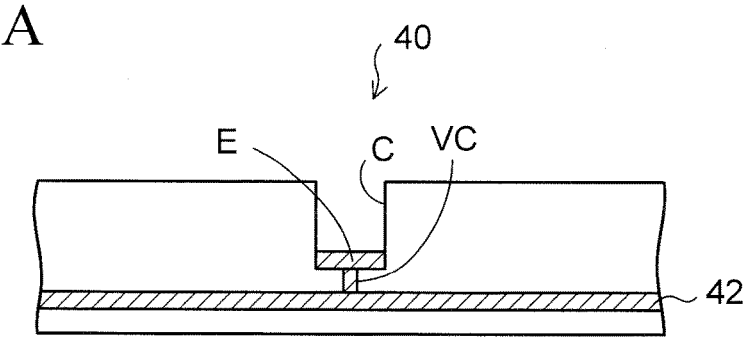
FIGS. 6A to 6C are cross-sectional views depicting the method of manufacturing an electrostatic chuck according to the first embodiment (part 4).

Thereafter, as depicted in FIG. 6A, a placing table 40 formed of ceramic is made by a method to sinter green sheets. As the ceramic material, a ceramic mainly including an aluminum oxide is preferably used, for example.

In the placing table 40, a concave portion C is formed on one face thereof, and a connection electrode E is arranged on a bottom face of the concave portion and is exposed from the bottom face. Moreover, an electrostatic electrode 42 is formed in an inner part of the placing table 40, and the connection electrode E is connected to the electrostatic electrode 42 through a via conductor VC.

The placing table 40 in FIG. 6A is made by a method including, forming tungsten paste which will be the connection electrode E, the electrostatic electrode 42, and the via conductor VC, in a surface and a penetration hole of a green sheet, laminating a plurality of green sheets, and sintering them.

Figure 6B:
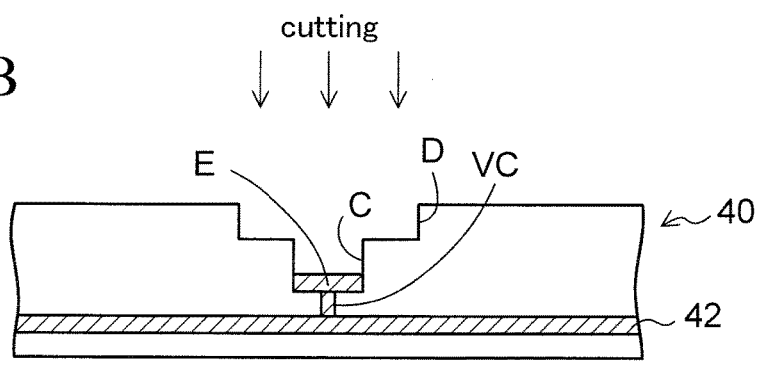

As mentioned in the explanation of the preliminary matter, in the method to sinter the green sheets, since the shrinkage is generated, there is a problem in which the positional accuracy of the concave portion C cannot be sufficiently ensured. For this reason, in this embodiment, as depicted in FIG. 6B, by cutting the placing table 40 by means of a router, a drill, or the like, a dent portion D is formed in the periphery of the concave portion C.

In this way, after a ceramic substrate in which the concave portion C is formed is obtained by sintering the green sheets, the dent portion D is formed in the periphery of the concave portion C by cutting. For this reason, the dent portion D can be formed in a state that the dent portion D is accurately aligned with the position of the protruding portion P of the first cylindrical insulating component 20 in FIG. 5 mentioned above.

The outer shape of the concave portion C and the outer shape of the dent portion D formed in the periphery thereof are made, for example, in a circular shape or a quadrangle shape in a plan view.

Note that, in the case that manufacturing an inexpensive electrostatic chuck in which high positional accuracy with the protruding portion P of the first cylindrical insulating component 20 is not required strictly, the concave portion C and the dent portion D can be formed in the stage of FIG. 6A simultaneously with the formation of the ceramic.

Figure 6C:
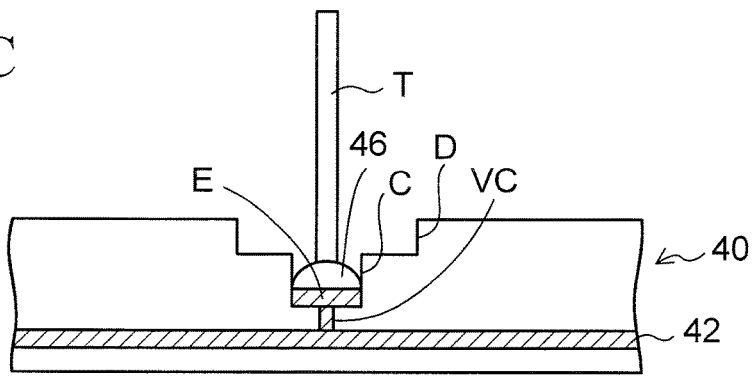

Further, as depicted in FIG. 6C, a power feeding terminal T is bonded to the connection electrode F of the placing table 40 by a solder layer 46. The power feeding terminal T is formed of a metal such as Kovar. In this way, the placing table 40 to which the power feeding terminal T is attached is made.

Alternatively, the power feeding terminal T may be bonded to the connection electrode E of the placing table 40 by a brazing material. In this case, for example, the power feeding terminal T which is formed of Kovar is bonded to the connection electrode E of the placing table 40, the connection electrode E formed of tungsten, by silver brazing.

Figure 7:
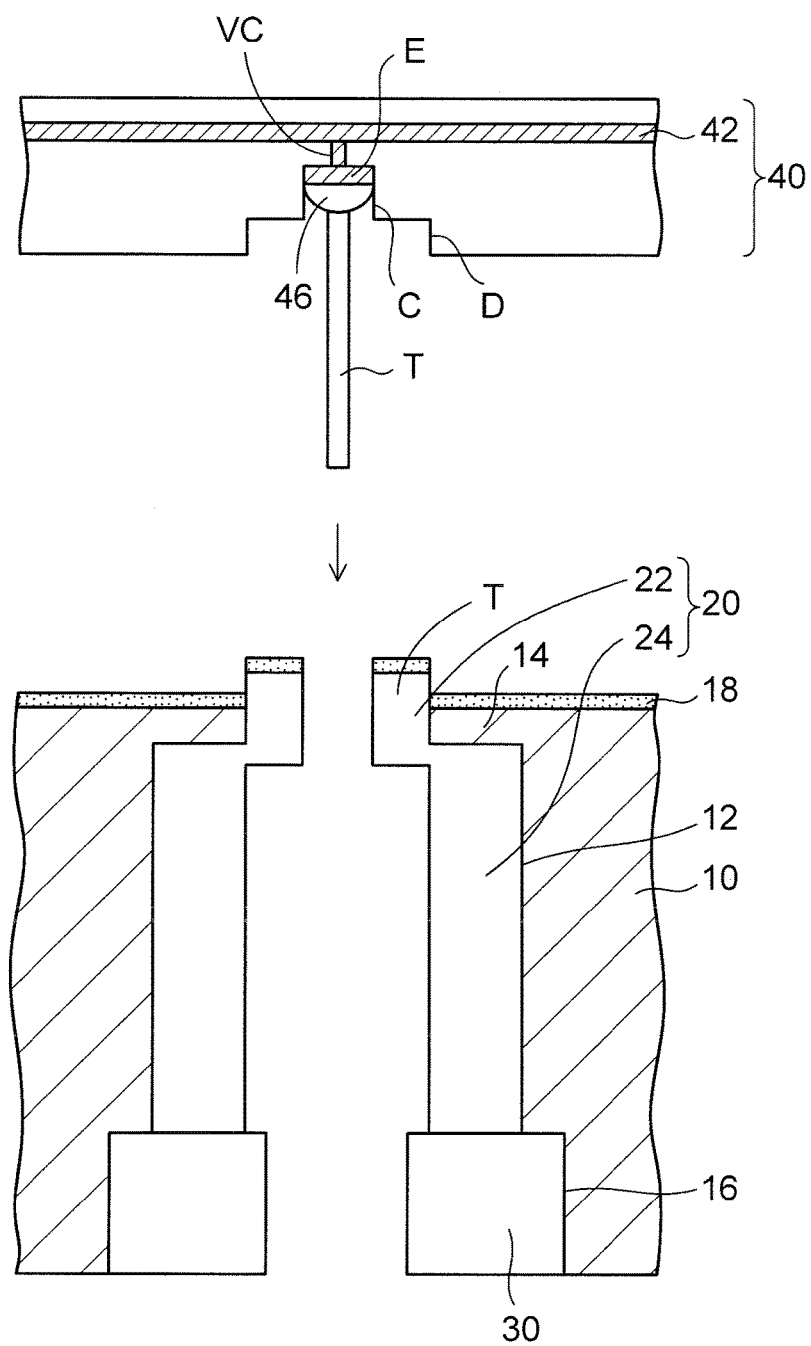
FIG. 7 is a cross-sectional view depicting the method of manufacturing an electrostatic chuck according to the first embodiment (part 5).

Subsequently, as depicted in FIG. 7, the placing table 40 in FIG. 6C is reversed up and down, and the base plate 10 in FIG. 5 mentioned above is prepared. Then, the power feeding terminal T attached to the placing table 40 is inserted into a hollow portion of the first cylindrical insulating component 20 attached to the base plate 10.

Figure 8:
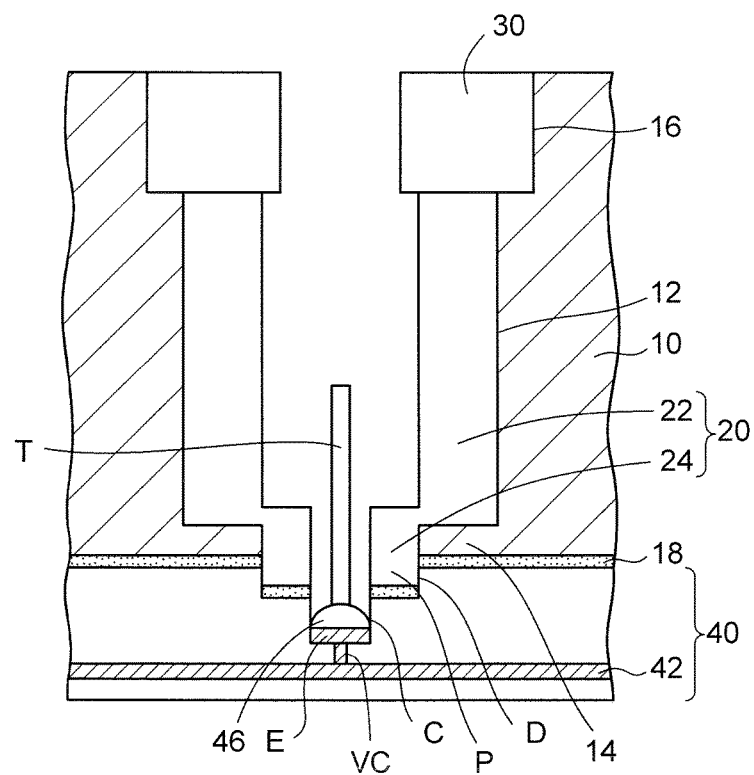
FIG. 8 is a cross-sectional view depicting the method of manufacturing an electrostatic chuck according to the first embodiment (part 6).

FIG. 8 depicts in a state that the base plate 10 and the placing table 40 in FIG. 7 are reversed up and down. As depicted in FIG. 8, the power feeding terminal T attached to the placing table 40 is arranged in an inner part of the first cylindrical insulating component 20 attached to the base plate 10.

Further, the protruding portion P of the first cylindrical insulating component 20 attached to the base plate 10 is fitted in the dent portion D of the placing table 40. By this matter, the protruding portion P of the first cylindrical insulating component 20 is arranged between the bonding part of the power feeding terminal T and the base plate 10, therefore the power feeding terminal T and the base plate 10 can be sufficiently insulated.

In this way, the base plate 10 is bonded to the placing table 40 by the adhesive layer 18, and simultaneously, a tip end face of the protruding portion P of the first cylindrical insulating component 20 is bonded to the dent portion D of the placing table 40 by the adhesive layer 18.

Figure 9:
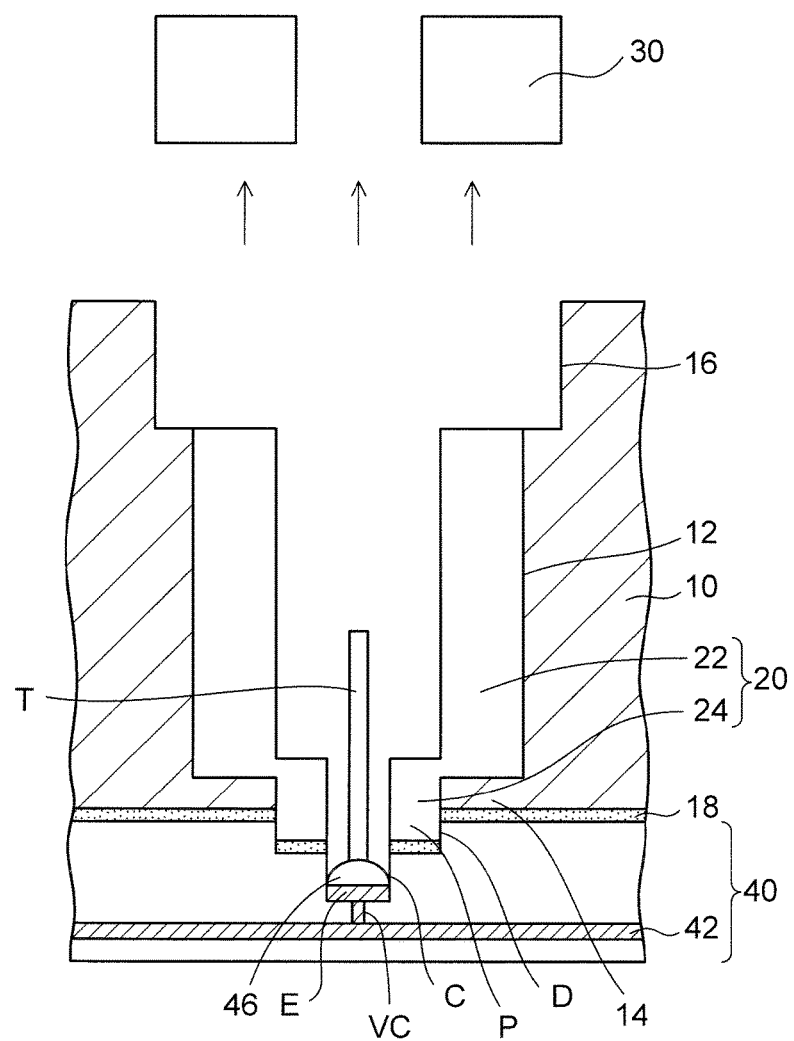
FIG. 9 is a cross-sectional view depicting the method of manufacturing an electrostatic chuck according to the first embodiment (part 7).

Thereafter, as depicted in FIG. 9, the second cylindrical insulating component 30 is temporarily detached from the structure in FIG. 8. Then, in the case that the adhesive layer 18 sticks out more than necessary from between the first cylindrical insulating component 20 and the placing table 40, the adhesive layer 18 which sticks out is removed.

Figure 10:
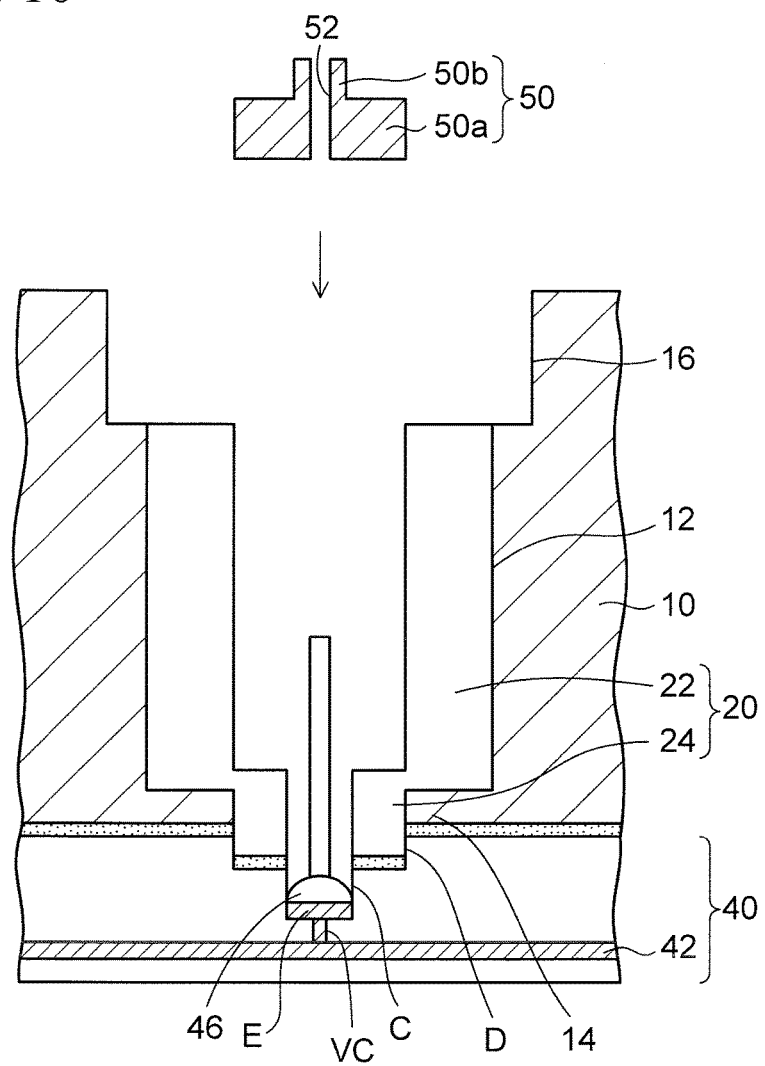
FIG. 10 is a cross-sectional view depicting the method of manufacturing an electrostatic chuck according to the first embodiment (part 8).

Subsequently, as depicted in FIG. 10, a first cylindrical conductive component 50 is prepared which includes a large diameter portion 50a in a lower side and a small diameter portion 50b in an upper side and is provided with an insertion hole 52 in an inner part thereof. The first cylindrical conductive component 50 is formed of a metallic material such as copper.

Second and third cylindrical conductive components to be mentioned later are formed of the same metallic material as well. The outer diameter of the large diameter portion 50a of the first cylindrical conductive component 50 is a size corresponding to the inner diameter of the first cylindrical portion 22 of the first cylindrical insulating component 20.

Figure 11:
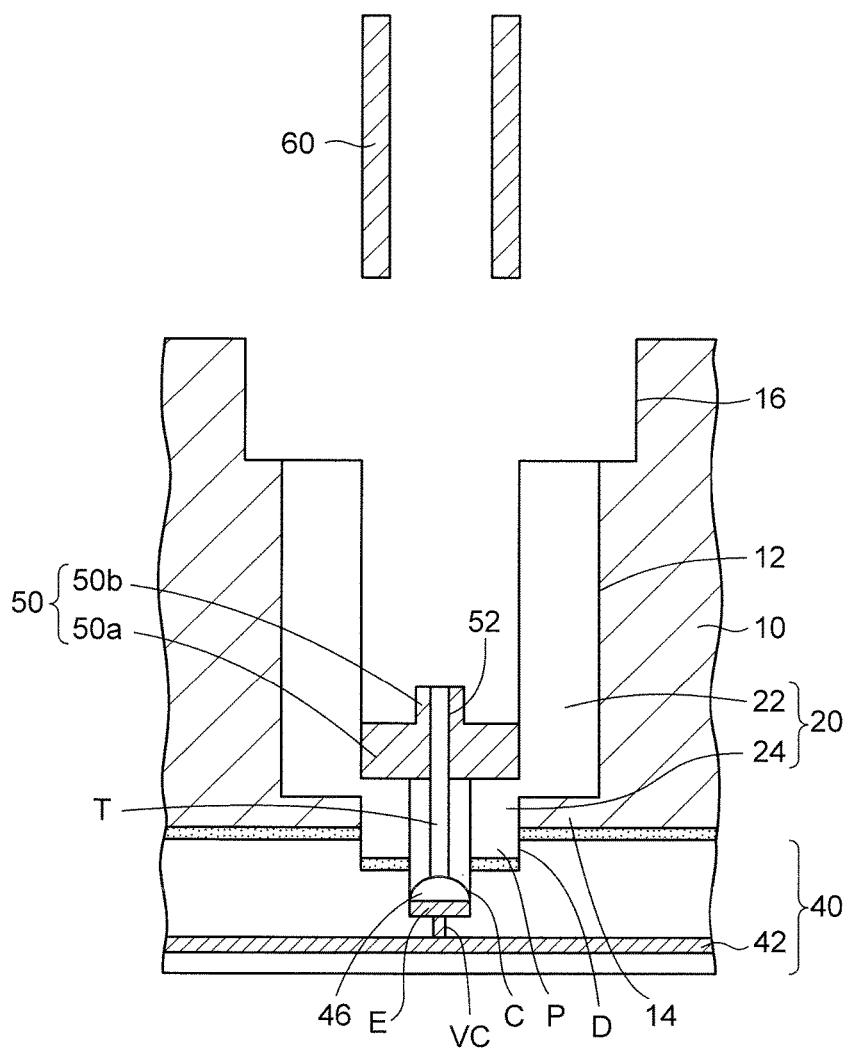
FIG. 11 is a cross-sectional view depicting the method of manufacturing an electrostatic chuck according to the first embodiment (part 9).

Then, as depicted in FIG. 11, the power feeding terminal T is inserted into the insertion hole 52 of the first cylindrical conductive component 50, thus the first cylindrical conductive component 50 is arranged on a back face of the protruding portion P of the first cylindrical insulating component 20. Further, the small diameter portion 50b of the first cylindrical conductive component 50 is swaged, thus its connecting part with the power feeding terminal T is firmly fastened.

In this way, it is in a state that a base end of the power feeding terminal T is coupled to the first cylindrical conductive component 50 and a tip end of the power feeding terminal T is bonded to the connection electrode E of the placing table 40 by the solder layer 46.

Further, similarly as depicted in FIG. 11, a second cylindrical conductive component 60 is prepared. The outer diameter of the second cylindrical conductive component 60 is a size corresponding to the inner diameter of the first cylindrical portion 22 of the first cylindrical insulating component 20. Moreover, the inner diameter of the second cylindrical conductive component 60 is one size larger than the outer diameter of the small diameter portion 50b of the first cylindrical conductive component 50.

Figure 12:
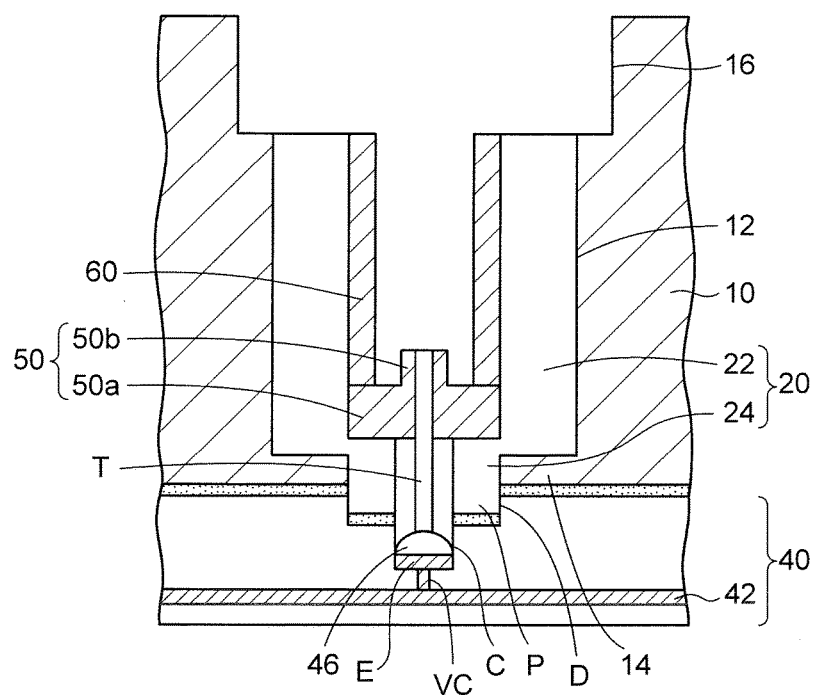
FIG. 12 is a cross-sectional view depicting the method of manufacturing an electrostatic chuck according to the first embodiment (part 10).

Then, as depicted in FIG. 12, the second cylindrical conductive component 60 is inserted into the inner part of the first cylindrical insulating component 20 and screwed to the first cylindrical insulating component 20.

Figure 13:
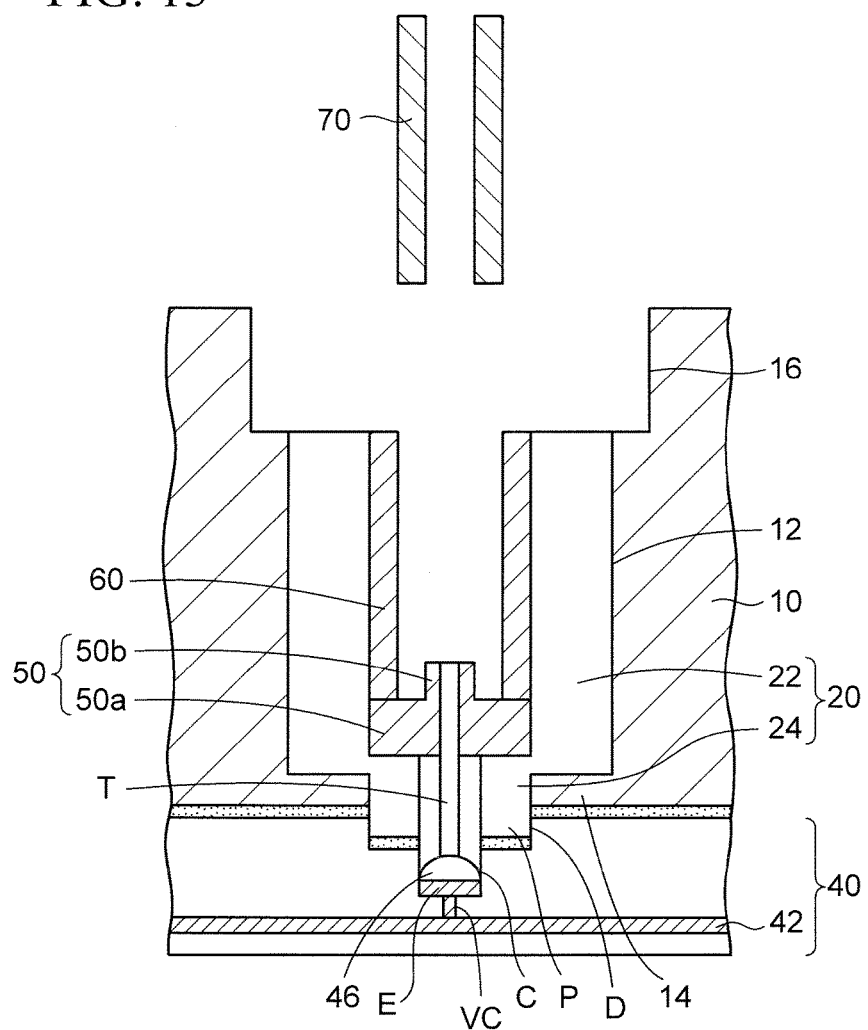
FIG. 13 is a cross-sectional view depicting the method of manufacturing an electrostatic chuck according to the first embodiment (part 11).

Thereafter, as depicted in FIG. 13, a third cylindrical conductive component 70 is prepared. The outer diameter of the third cylindrical conductive component 70 is a size corresponding to the inner diameter of the second cylindrical conductive component 60. Moreover, the inner diameter of the third cylindrical conductive component 70 is a size corresponding to the outer diameter of the small diameter portion 50b of the first cylindrical conductive component 50.

Figure 14:
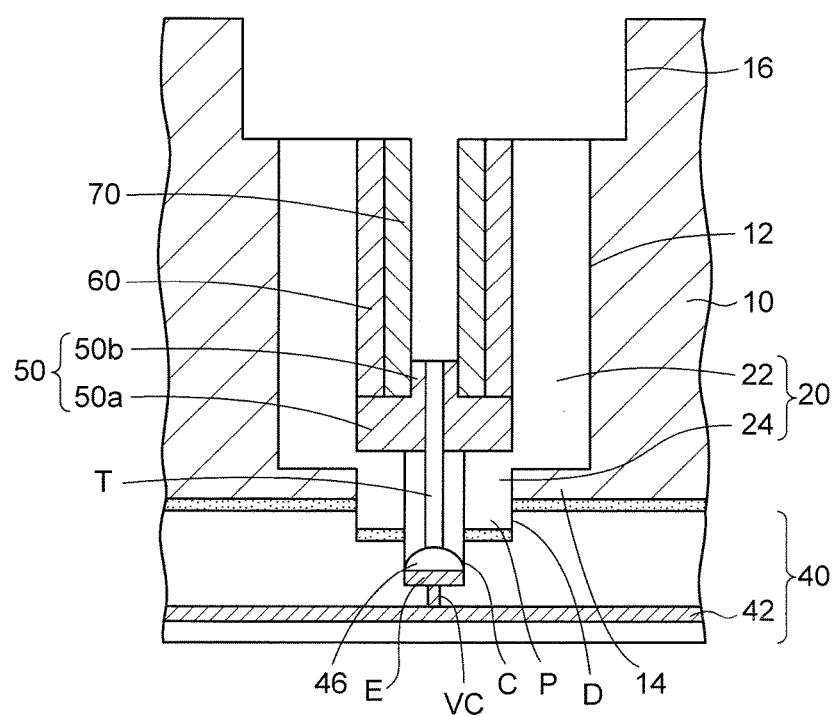
FIG. 14 is a cross-sectional view depicting the method of manufacturing an electrostatic chuck according to the first embodiment (part 12).

Then, as depicted in FIG. 14, the third cylindrical conductive component 70 is screwed onto the small diameter portion 50b of the first cylindrical conductive component 50.

Figure 15:
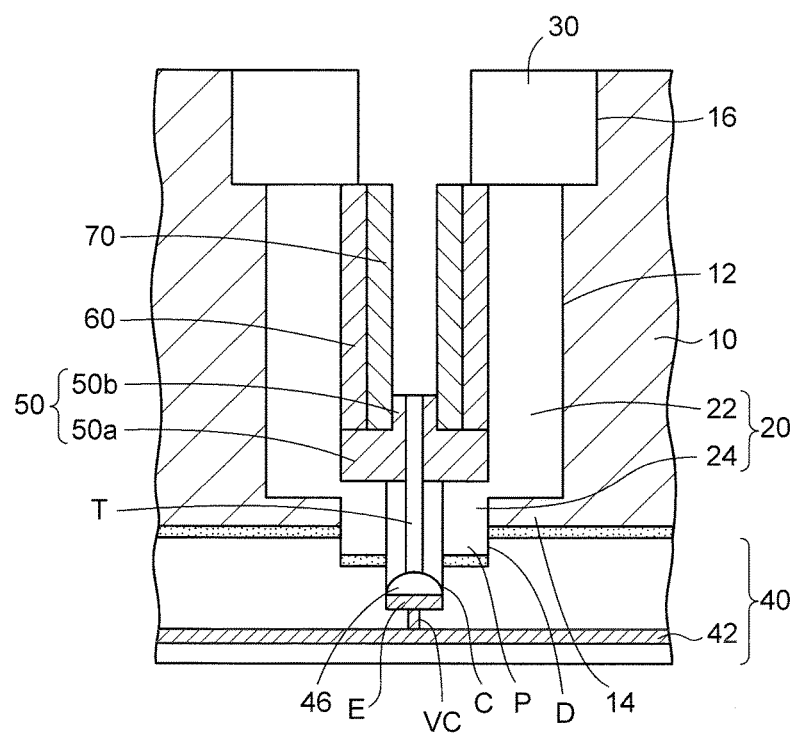
FIG. 15 is a cross-sectional view depicting the method of manufacturing an electrostatic chuck according to the first embodiment (part 13).

Thereafter, as depicted in FIG. 15, the second cylindrical insulating component 30 detached in the step of FIG. 9 mentioned above is screwed into the base plate 10.

As depicted in FIG. 16, the structure in FIG. 15 is reversed up and down, thereby an electrostatic chuck 1 of the first embodiment is obtained.

As depicted in FIG. 16, the electrostatic chuck 1 of the first embodiment includes the base plate 10 having the penetration hole 12 in the thickness direction. The first cylindrical insulating component 20 is inserted in the penetration hole 12 of the base plate 10.

The first cylindrical insulating component 20 includes the first cylindrical portion 22 and the second cylindrical portion 24 smaller than the first cylindrical portion 22 in outer diameter and inner diameter. An upper part of the second cylindrical portion 24 of the first cylindrical insulating component 20 is arranged as the protruding portion P protruding from the upper end of the penetration hole 12 of the base plate 10.

Moreover, the first cylindrical conductive component 50 in which the insertion hole 52 is provided in the inner part, is arranged under the second cylindrical portion 24 inside the hollow portion of the first cylindrical insulating component 20. The first cylindrical conductive component 50 is formed of the large diameter portion 50a and the small diameter portion 50b, and the large diameter portion 50a is arranged in the upper side.

The second cylindrical conductive component 60 is arranged under the large diameter portion 50a of the first cylindrical conductive component 50. An outer face of the second cylindrical conductive component 60 is arranged on an inner wall of the first cylindrical portion 22 of the first cylindrical insulating component 20. The second cylindrical conductive component 60 is electrically connected to the first cylindrical conductive component 50.

Further, the third cylindrical conductive component 70 is arranged inside the second cylindrical conductive component 60, and the third cylindrical conductive component 70 is screwed to the small diameter portion 50b of the first cylindrical conductive component 50. The third cylindrical conductive component 70 is electrically connected to the first cylindrical conductive component 50 and the second cylindrical conductive component 60.

Moreover, the second cylindrical insulating component 30 is arranged on a lower face of the first cylindrical insulating component 20 and an upper face of the level difference portion 16 of the base plate 10. An outer face of the second cylindrical insulating component 30 is arranged on the inner wall of the level difference portion 16 of the base plate 10.

Furthermore, the placing table 40 is bonded to the base plate 10 by the adhesive layer 18 and is arranged thereon.

The dent portion D is formed in a lower face of the placing table 40. The dent portion D is arranged to correspond to the position of the protruding portion P of the first cylindrical insulating component 20. Moreover, the concave portion C is formed in a bottom face of the dent portion D. The concave portion C is arranged to correspond to the position of the hollow portion of the first cylindrical insulating component 20.

Then, the protruding portion P of the first cylindrical insulating component 20 is fitted in the dent portion D of the placing table 40. The connection electrode E is formed on the bottom face of the concave portion C of the placing table 40. The connection electrode E is connected through the via conductor VC to the electrostatic electrode 42 formed in the inner part of the placing table 40.

Further, the tip end of the power feeding terminal T is connected to the connection electrode E of the placing table 40 by bonding using the solder layer 46. Alternatively, the power feeding terminal T may be bonded to the connection electrode E of the placing table 40 by a brazing material. The base end of the power feeding terminal T is inserted in and coupled to the insertion hole 52 of the first cylindrical conductive component 50 and electrically connected to the first cylindrical conductive component 50.

A connector 6 is constituted by the first cylindrical conductive component 50, the second cylindrical conductive component 60, the third cylindrical conductive component 70, and the power feeding terminal T. Then, a banana jack or the like is to be screwed into an inner wall of the third cylindrical conductive component 70 of the connector 6.

In this way, voltage is supplied from the third cylindrical conductive component 70 to the power feeding terminal T through the first cylindrical conductive component 50. Further, the voltage is applied from the power feeding terminal T to the electrostatic electrode 42 through the connection electrode E and the via conductor VC.

When a positive (+) voltage is applied to the electrostatic electrode 42 of the placing table 40, the electrostatic electrode 42 is charged with positive (+) charges, and negative (−) charges are induced in an attracting target such as a silicon wafer. By this matter, the attracting target is attracted to the placing table 40 by the coulomb force.

In the electrostatic chuck 1 of the first embodiment, as mentioned above, the dent portion D formed in the periphery of the concave portion C of the placing table 40 is formed with good positional accuracy so as to correspond to the position of the protruding portion P of the first cylindrical insulating component 20. Then, the protruding portion P of the first cylindrical insulating component 20 is arranged in the dent portion D of the placing table 40.

FIG. 17 depicts an electrostatic chuck 1a in which the concave portion C of the placing table 40 is arranged to be shifted from the center of the penetration hole 12 of the base plate 10. As mentioned above, this is because, the concave portion C of the placing table 40 is formed by sintering the green sheets, thus sufficient positional accuracy cannot be ensured.

However, in this embodiment, even if the concave portion C of the placing table 40 is arranged to be shifted, the dent portion D can be formed in the periphery of the concave portion C of the placing table 40 with good positional accuracy so as to correspond to the position of the protruding portion P of the first cylindrical insulating component 20 attached to the base plate 10.

As mentioned above, this is because, the dent portion D is not formed at the time of sintering the green sheets, but is formed by cutting with a router, a drill, or the like after sintering the green sheets.

For this reason, as depicted in FIG. 17, even if the concave portion C of the placing table 40 is arranged to be shifted, the protruding portion P of the first cylindrical insulating component 20 can be accurately arranged in the dent portion D in the periphery of the concave portion C.

Accordingly, even if the concave portion C of the placing table 40 is shifted, thereby the bonding part of the power feeding terminal T approaches the base plate 10, the protruding portion P of the first cylindrical insulating component 20 is surely arranged between the bonding part of the power feeding terminal T and the base plate 10 (a part indicated by A). By this matter, the insulation between the bonding part of the power feeding terminal T and the base plate 10 is enhanced.

Therefore, it is prevented that electric discharge is generated between the bonding part of the power feeding terminal T and the base plate 10. As a result, the durability of the electrostatic chuck is improved, thus the life time of the electrostatic chuck can be extend. Therefore, a reliable electrostatic chuck can be constituted.

Also, the positional accuracy of the concave portion C of the placing table 40 tends to worsen further by increase in diameter of the attracting target such as a silicon wafer. However, by employing the structure of the electrostatic chuck of this embodiment, even when the diameter of the attracting target is increased, it can ensure high reliability.

The electrostatic chuck 1a in FIG. 17 is the same as the electrostatic chuck 1 in FIG. 16 except that the concave portion C of the placing table 40 is arranged to be shifted.

Note that, the electrostatic chucks 1 and 1a in FIG. 16 and FIG. 17 may include a heater. The heater may be arranged between the base plate 10 and the placing table 40, or the heater may be built into the placing table 40.

(Second Embodiment)

Figure 24:
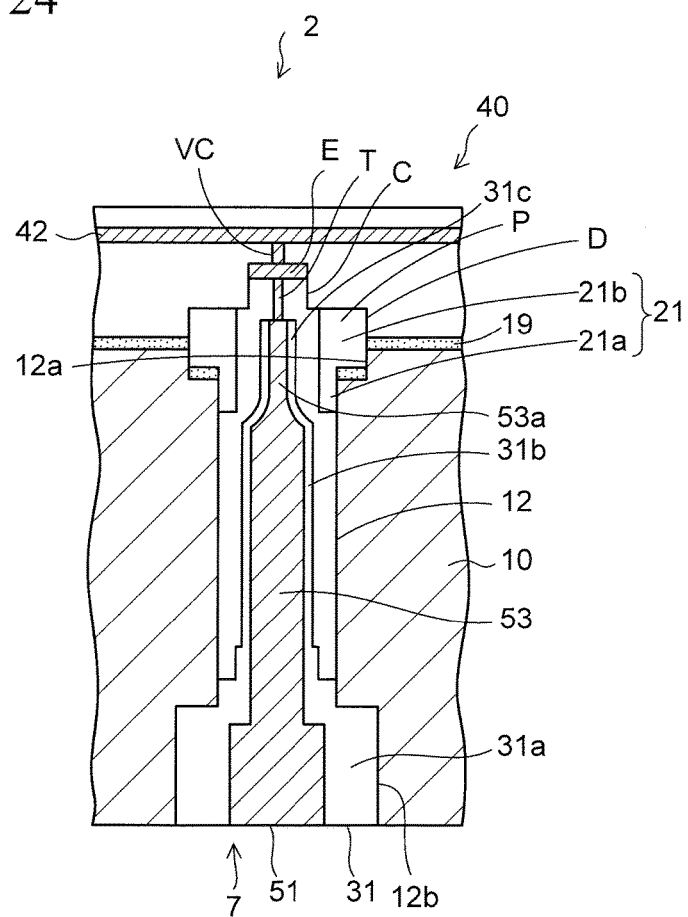
FIG. 24 is a cross-sectional view depicting an electrostatic chuck according to the second embodiment (part 1).
Figure 25:
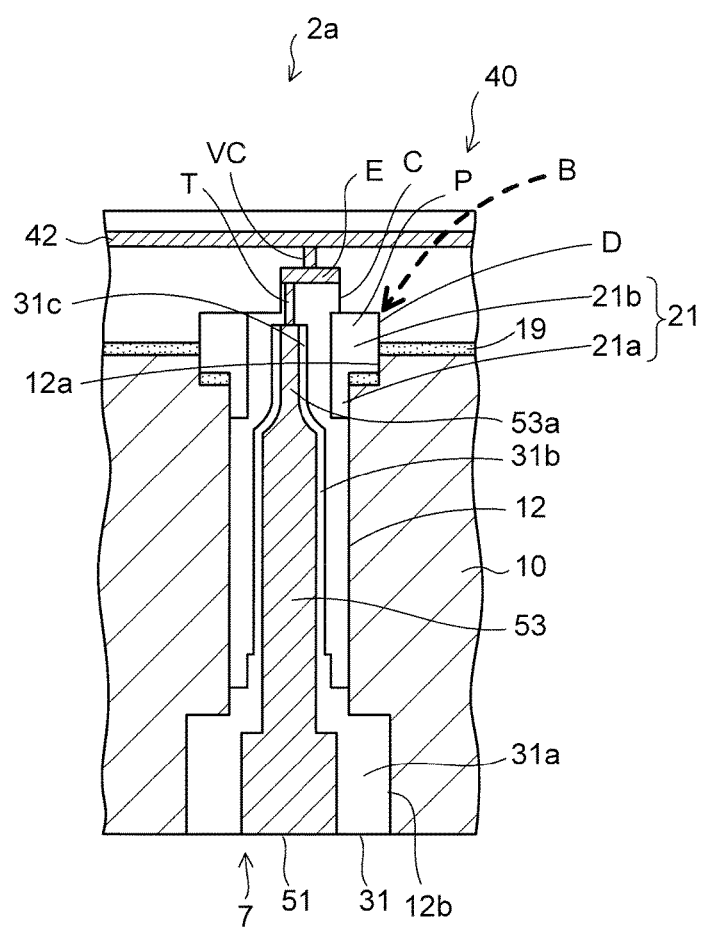
FIG. 25 is a cross-sectional view depicting an electrostatic chuck according to the second embodiment (part 2).

FIG. 18 to FIG. 23 are views depicting a method of manufacturing an electrostatic chuck of a second embodiment. FIG. 24 and FIG. 25 are views depicting electrostatic chucks of the second embodiment.

The second embodiment will be explained by enumerating, as an example, an electrostatic chuck of a type in which a power feeding terminal having elasticity touches a connection electrode of a placing table and is connected to the connection electrode.

Figure 18:
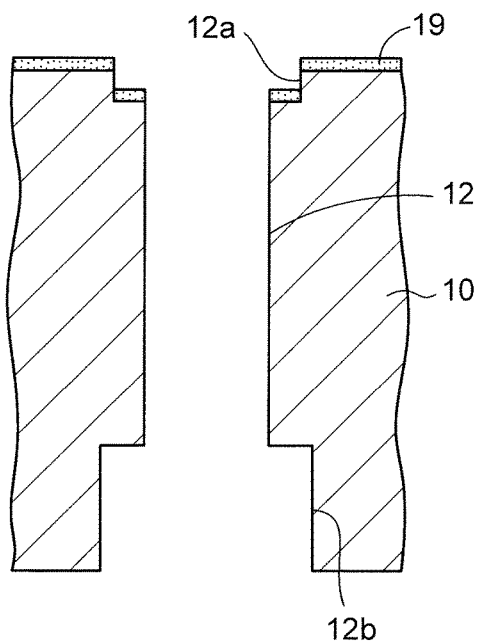
FIG. 18 is a cross-sectional view depicting a method of manufacturing an electrostatic chuck according to a second embodiment (part 1).

In the method of manufacturing an electrostatic chuck of the second embodiment, as depicted in FIG. 18, first, a base plate 10 including a penetration hole 12 in the thickness direction is prepared. In the base plate 10, a first level difference portion 12a including an inner wall receding outward is formed in an upper end side of the penetration hole 12, and a second level difference portion 12b including an inner wall receding outward is formed in a lower end side of the penetration hole 12.

Further, a silicone resin-based adhesive layer 19 is formed on an upper face of the base plate 10 by using a screen mask.

Figure 19:
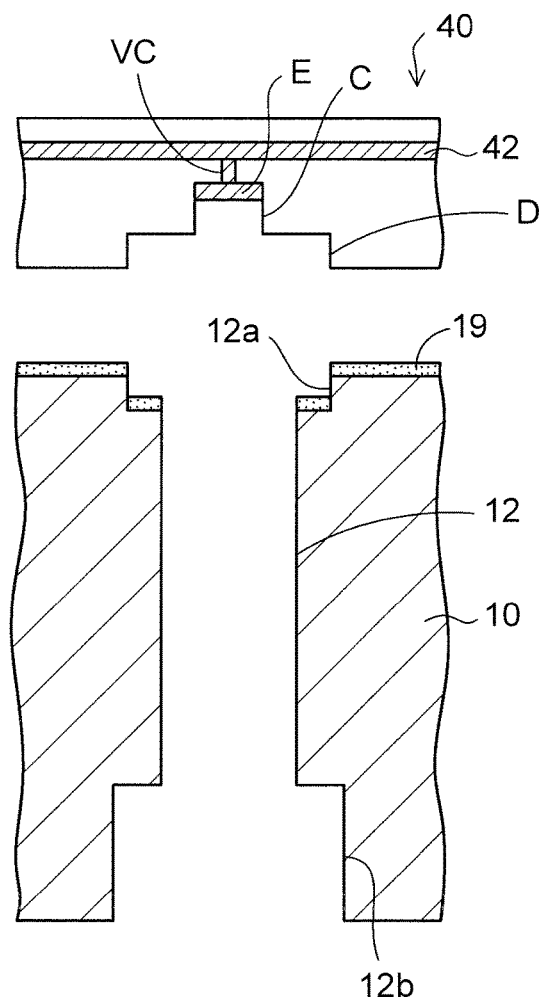
FIG. 19 is a cross-sectional view depicting the method of manufacturing an electrostatic chuck according to the second embodiment (part 2).

Thereafter, as depicted in FIG. 19, a placing table 40 having the same structure as FIG. 6B in the first embodiment mentioned above is prepared.

Figure 20:
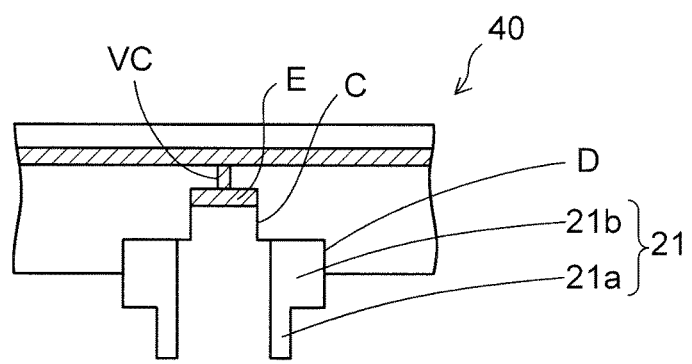
FIG. 20 is a cross-sectional view depicting the method of manufacturing an electrostatic chuck according to the second embodiment (part 3).
Figure 20:
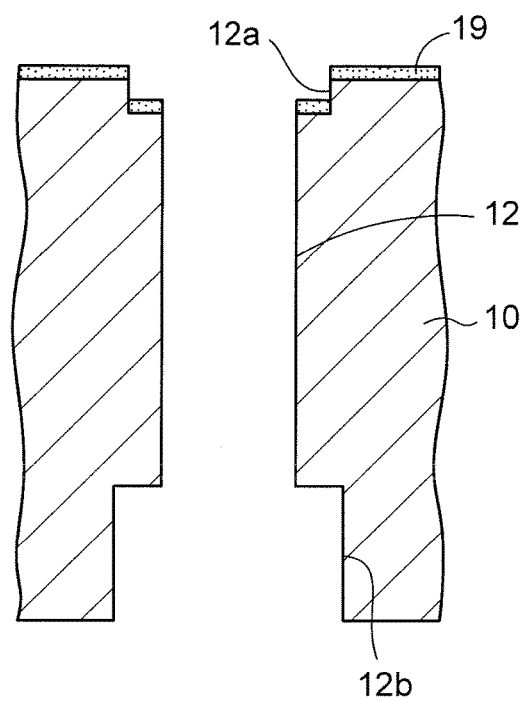

Further, as depicted in FIG. 20, a first cylindrical insulating component 21 is prepared. The first cylindrical insulating component 21 includes a first cylindrical portion 21a in a lower side and a second cylindrical portion 21b in an upper side. The inner diameter of the first cylindrical insulating component 21 is the same over the whole, and the outer diameter of the second cylindrical portion 21b is set to be larger than the outer diameter of the first cylindrical portion 21a.

The first cylindrical insulating component 21 is formed of the same insulating resin material as the first and second cylindrical insulating components 20 and 30 of the first embodiment mentioned above.

Then, an epoxy resin-based adhesive layer (not depicted) is coated on an upper part of the second cylindrical portion 21b of the first cylindrical insulating component 21, and the second cylindrical portion 21b of the first cylindrical insulating component 21 is bonded and fitted to the dent portion D of the placing table 40.

As explained in the first embodiment, the dent portion D formed in the periphery of the concave portion C of the placing table 40 is formed with good positional accuracy so as to correspond to the first cylindrical insulating component 21. For this reason, even if the concave portion C of the placing table 40 is arranged to be shifted, the first cylindrical insulating component 21 can be arranged in the dent portion D of the placing table 40 with good positional accuracy.

A part of the second cylindrical portion 21b protruding from a lower face of the placing table 40 corresponds to the first level difference portion 12a of the base plate 10.

Figure 21:
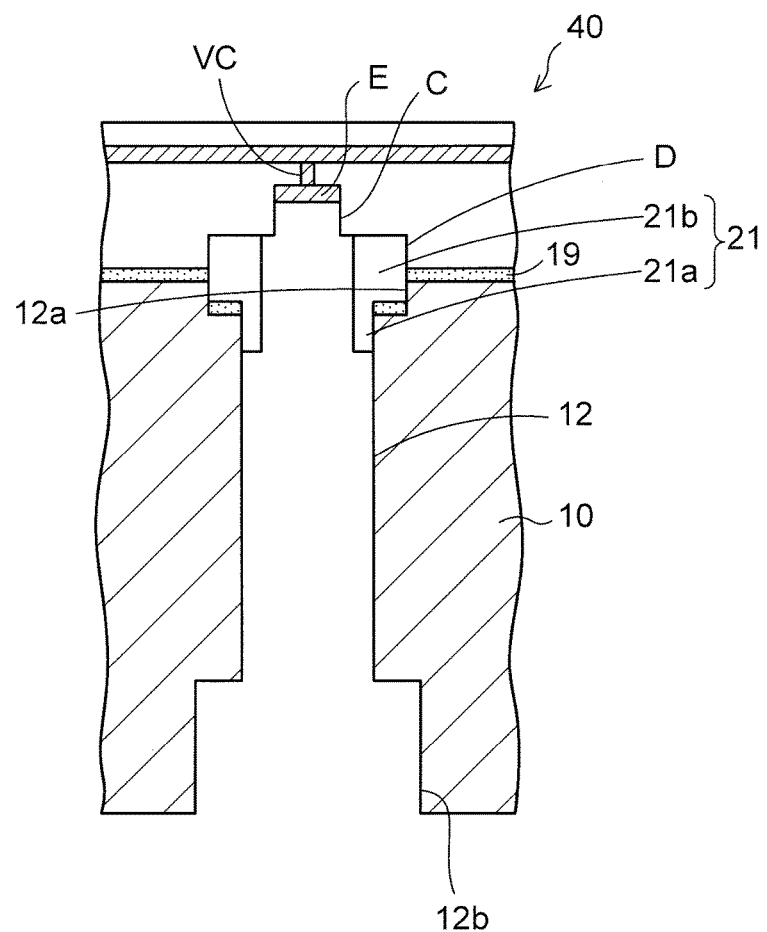
FIG. 21 is a cross-sectional view depicting the method of manufacturing an electrostatic chuck according to the second embodiment (part 4).

Then, as depicted in FIG. 21, a lower face side of the placing table 40 in FIG. 20 is bonded to the base plate 10 by the adhesive layer 19 and is arranged thereon. At this time, a lower part of the second cylindrical portion 21b of the first cylindrical insulating component 21 attached to the placing table 40 is arranged on the first level difference portion 12a of the base plate 10, and an outer face of the first cylindrical portion 21a is arranged on an inner wall of the penetration hole 12 of the base plate 10.

Figure 22:
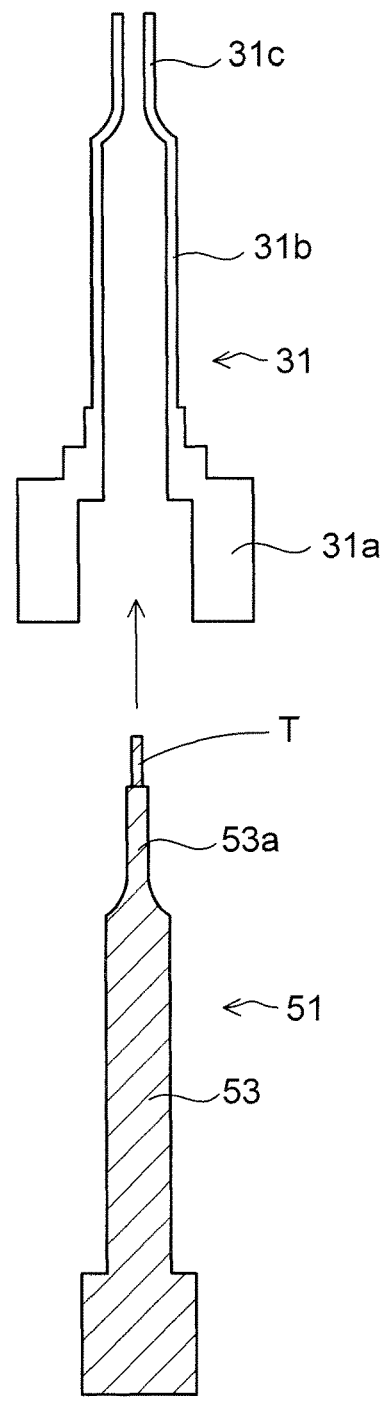
FIG. 22 is a cross-sectional view depicting the method of manufacturing an electrostatic chuck according to the second embodiment (part 5).

Subsequently, as depicted in FIG. 22, a second cylindrical insulating component 31 having a long narrow shape is prepared. The second cylindrical insulating component 31 includes a lower cylindrical portion 31a, a middle cylindrical portion 31b, and an upper cylindrical portion 31c, and has such a shape that an outer diameter and an inner diameter stepwisely become small from a lower side toward an upper side.

Further, a conductive component 51 having a long narrow shape is prepared. The conductive component 51 includes, a holder 53 including a cylindrical member 53a having an elastic body such as a spring in an inner part thereof, and a power feeding terminal T coupled to the elastic body inside the cylindrical member 53a.

The shape of an outer face of the conductive component 51 corresponds to the shape of an inner face of the second cylindrical insulating component 31 mentioned above. Then, an epoxy resin-based adhesive layer (not depicted) is coated on the holder 53 of the conductive component 51, and the conductive component 51 is inserted to an inner part of the second cylindrical insulating component 31 to bond both in the inside.

Figure 23:
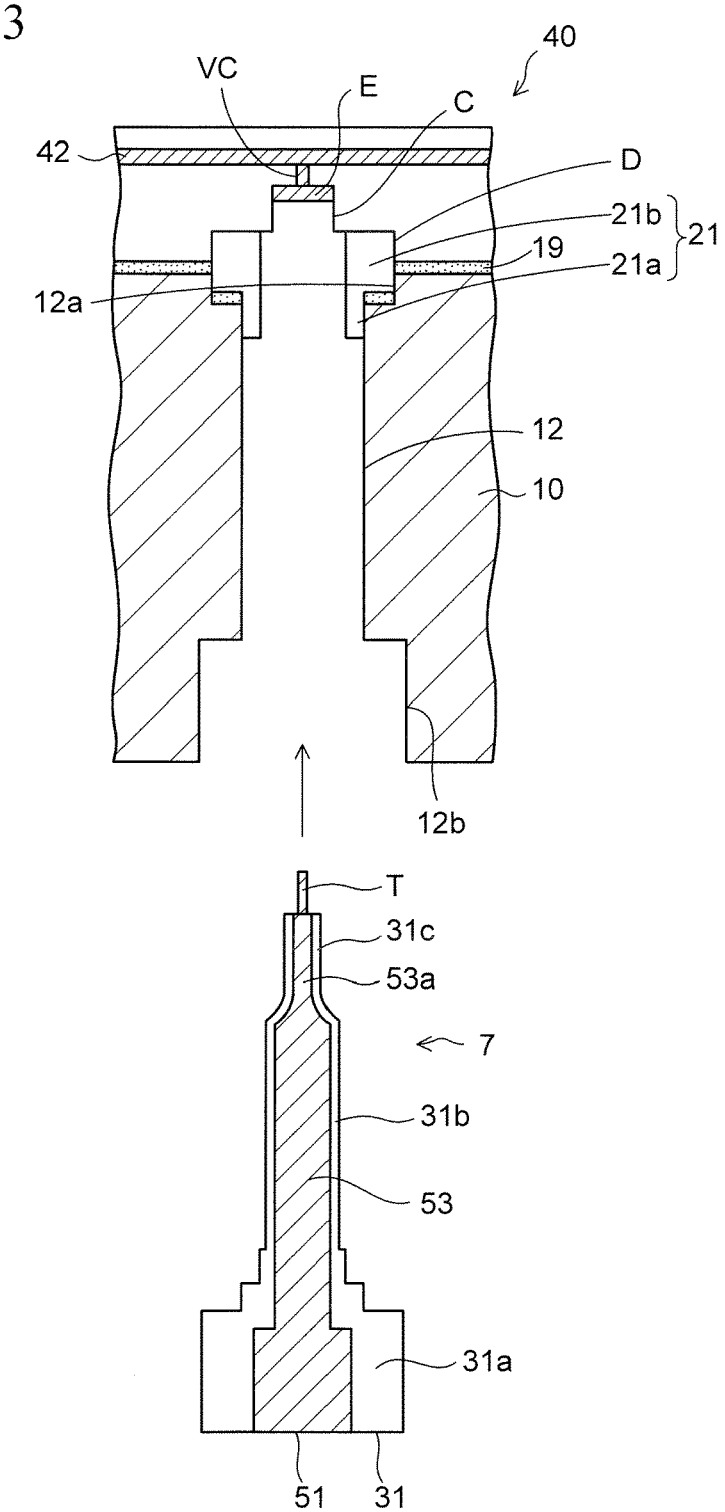
FIG. 23 is a cross-sectional view depicting the method of manufacturing an electrostatic chuck according to the second embodiment (part 6).

By this matter, as depicted in FIG. 23, a connector 7 is constituted by the second cylindrical insulating component 31 and the conductive component 51. In the connector 7, the power feeding terminal T of the conductive component 51 protrudes from a tip end of the upper cylindrical portion 31c of the second cylindrical insulating component 31. Since the power feeding terminal T is coupled to the elastic body inside the conductive component 51, the power feeding terminal T has elasticity in the upper and lower direction.

Thereafter, as depicted in FIG. 23 and FIG. 24, the connector 7 is inserted into the penetration hole 12 of the base plate 10 in the structure in FIG. 21 mentioned above. Then, as depicted in FIG. 24, a screw thread (not depicted) on the lower cylindrical portion 31a of the connector 7 is screwed to a screw thread (not depicted) on the second level difference portion 12b in the penetration hole 12 of the base plate 10.

By this matter, the power feeding terminal T of the connector 7 is inserted in an inner part of the first cylindrical insulating component 21, and a tip end of the power feeding terminal T touches the connection electrode E of the placing table 40. The power feeding terminal T is fixed in a state of pressing the connection electrode E by the action of the elastic body.

In this way, voltage is supplied from the power feeding terminal T of the connector 7 to the connection electrode E of the placing table 40, and the voltage is applied to the electrostatic electrode 42 through the via conductor VC.

By the above steps, an electrostatic chuck 2 of the second embodiment is obtained.

The electrostatic chuck 2 of the second embodiment includes the base plate 10 having the penetration hole 12 in the thickness direction. The lower part of the second cylindrical portion 21b of the first cylindrical insulating component 21 having the above-described structure is arranged on the first level difference portion 12a in a tip end side of the penetration hole 12 of the base plate 10. Then, the upper part of the second cylindrical portion 21b of the first cylindrical insulating component 21 is arranged as a protruding portion P protruding from an upper end of the penetration hole 12.

The placing table 40 having the above-described structure is bonded to the base plate 10 and the first cylindrical insulating component 21 by the adhesive layer 19 and is arranged thereon. The protruding portion P of the second cylindrical portion 21b of the first cylindrical insulating component 21 is fitted in the dent portion D of the placing table 40.

Moreover, the connector 7 having the above-described structure is screwed to the penetration hole 12 of the base plate 10 and is arranged therein. The tip end of the power feeding terminal T of the connector 7 touches the connection electrode E of the placing table 40 and is connected to it. A base end of the power feeding terminal T is coupled to the elastic body inside the connector 7, and is fixed to press the connection electrode E by the elastic force.

In this way, voltage is supplied from the power feeding terminal T of the connector 7 to the connection electrode E of the placing table 40, and the voltage is applied to the electrostatic electrode 42 through the via conductor VC.

In the electrostatic chuck 2 of the second embodiment, similarly to the electrostatic chuck 1 of the first embodiment described above, the dent portion D formed in the periphery of the concave portion C of the placing table 40 is formed with good position accuracy so as to correspond to the first cylindrical insulating component 21. Then, the protruding portion P of the second cylindrical portion 21b of the first cylindrical insulating component 21 is arranged in the dent portion D of the placing table 40.

FIG. 25 depicts an electrostatic chuck 2a in which the concave portion C of the placing table 40 is arranged to be shifted from the center of the penetration hole 12 of the base plate 10. However, similarly to the first embodiment, even if the concave portion C of the placing table 40 is arranged to be shifted, the dent portion D can be formed in the periphery of the concave portion C of the placing table 40 with good positional accuracy so as to correspond to the protruding portion P of the second cylindrical portion 21b of the first cylindrical insulating component 21.

For this reason, even if the concave portion C of the placing table 40 is arranged to be shifted, thereby the connection electrode E approaches the base plate 10, the second cylindrical portion 21b of the first cylindrical insulating component 21 is surely arranged between the connection electrode E and the base plate 10 (a part indicated by B).

By this matter, in the second embodiment, it is prevented that electric discharge is generated between the connection electrode E of the placing table 40 and the base plate 10.

The electrostatic chucks 2 and 2a of the second embodiment in FIG. 24 and FIG. 25 may include a heater as well.

Figure 26:
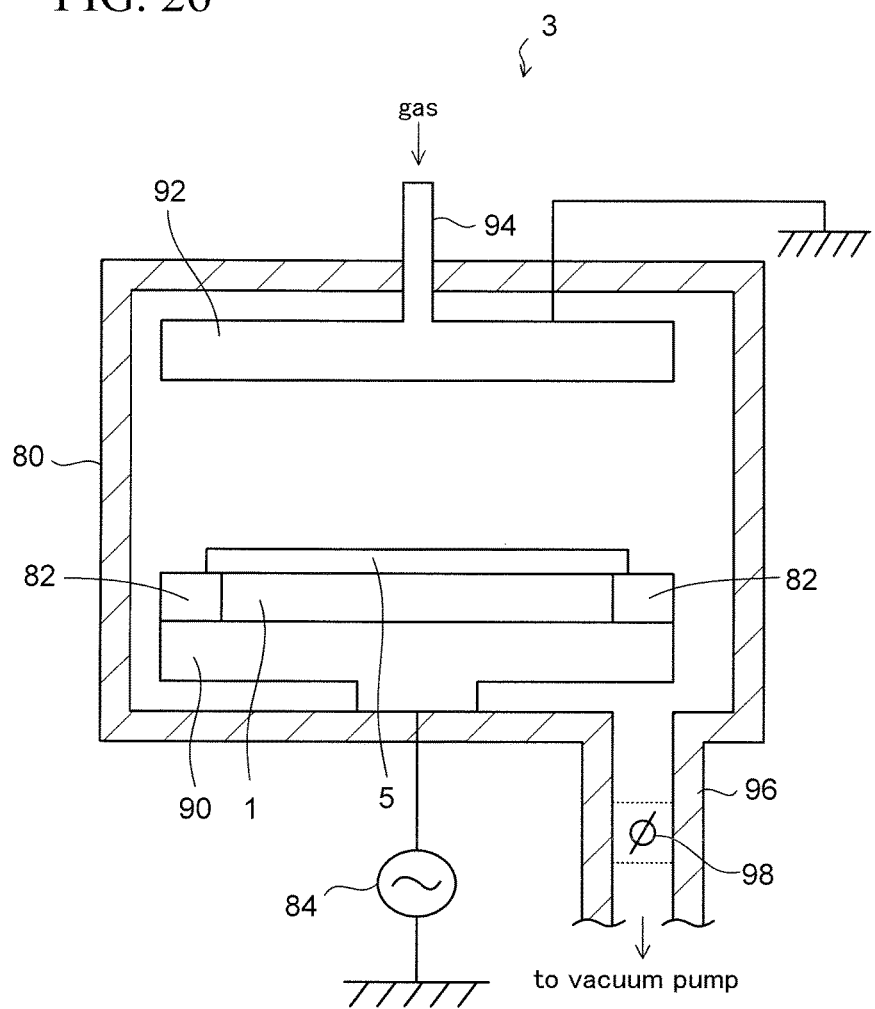
FIG. 26 is a cross-sectional view depicting one example of a semiconductor-liquid crystal manufacturing apparatus including the electrostatic chuck of the first embodiment.

Next, a semiconductor-liquid crystal manufacturing apparatus including one of the electrostatic chucks of the embodiments described above will be explained. The following explanation will be given by enumerating a dry etching apparatus including the electrostatic chuck 1 of the embodiment in FIG. 16 as an example. FIG. 26 is a cross-sectional view depicting the dry etching apparatus of the embodiment. As depicted in FIG. 26, a parallel-plate-type RIE apparatus is illustrated as a dry etching apparatus 3.

The dry etching apparatus 3 includes a chamber 80, and a lower electrode 90 is arranged in a lower side of the chamber 80. The electrostatic chuck 1 of the embodiment described above (FIG. 16) is attached to a front face side of the lower electrode 90.

According to various etching process, an electrostatic chuck of a type to cool itself by circulating cooling water, an electrostatic chuck of a type to heat itself by a heater, or the like, is selected.

A quartz ring 82 for protection is arranged in the periphery of the electrostatic chuck 1. A high-frequency power source 84 for applying RE power is connected to the lower electrode 90 and the electrostatic chuck 1. An RF matcher (not depicted) for matching of the output of the RF power is connected to the high-frequency power source 84.

An upper electrode 92 which is an opposite electrode of the lower electrode 90 is arranged in an upper side in the chamber 80, and the upper electrode 92 is grounded. A gas introduction pipe 94 is coupled to the upper electrode 92, and a predetermined etching gas is introduced into the chamber 80.

An exhaust pipe 96 is connected to a lower part of the chamber 80, and a vacuum pump is attached to a distal end of the exhaust pipe 96. By this matter, reaction products or the like generated by the etching are exhausted to an exhaust gas treatment apparatus in the outside through the exhaust pipe 96. APC valve (Automatic pressure control valve) 98 is provided in the exhaust pipe 96 near the chamber 80, and the opening degree of the APC valve 98 is automatically adjusted such that the inside of the chamber 80 can be a set pressure.

In the dry etching apparatus 3 of this embodiment, a semiconductor wafer 5 is conveyed and placed on the electrostatic chuck 1. Then, the semiconductor wafer 5 is attracted to the electrostatic chuck 1 by applying a predetermined voltage to the electrostatic electrode 42 (FIG. 16) of the electrostatic chuck 1.

Thereafter, a halogen gas such as a chlorine-including gas or a fluorine-including gas is introduced into the chamber 80 through the gas introduction pipe 94, and the inside of the chamber 80 is set to a predetermined pressure by the function of the APC valve 98. Then, the RF power is applied to the lower electrode 90 and the electrostatic chuck 1 from the high-frequency power source 84, thereby plasma is generated inside the chamber 80.

By applying the RF power to the electrostatic chuck 1, a negative self-bias is formed on the electrostatic chuck 1 side, as the result, positive ions in the plasma are accelerated toward the electrostatic chuck 1. A polysilicon layer, a silicon oxide layer, an aluminum alloy layer which is wiring material, or the like is available as an etching target layer, for example.

As mentioned above, in the electrostatic chuck 1 of this embodiment, when the RF power is applied to the electrostatic chuck 1, it is prevented that the electric discharge is generated in the inner part thereof. For this reason, voltage can be stably applied to the electrostatic electrode 42 of the placing table 40. Therefore, it is possible to sequentially attract many semiconductor wafers 5 reliably.

In FIG. 26, the electrostatic chuck 1 of this embodiment is applied to a dry etching apparatus. However, the electrostatic chuck 1 may be applied to various types of semiconductor-liquid crystal manufacturing apparatuses to be used for manufacturing process of semiconductor devices and liquid crystal displays such as plasma CVD apparatuses and sputtering apparatuses.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electrostatic chuck, comprising:
   a base plate including a penetration hole;
   a cylindrical insulating component inserted in the penetration hole, the cylindrical insulating component including a protruding portion protruding from an upper end of the penetration hole;
   a placing table arranged on the base plate;
   a dent portion formed in a lower face of the placing table, the dent portion in which the protruding portion of the cylindrical insulating component is fitted;
   a concave portion formed in the dent portion of the placing table;
   an electrode formed in the concave portion of the placing table;
   a power feeding terminal arranged in an inner part of the cylindrical insulating component, the power feeding terminal connected to the electrode;
   a first cylindrical conductive component arranged inside the cylindrical insulating component, the first cylindrical conductive component comprising a small diameter portion and a large diameter portion arranged over the small diameter portion, where a diameter of the small diameter portion being smaller than a diameter of the large diameter portion, and an insertion hole is formed in the first cylindrical conductive component, where the power feeding terminal being inserted into and fixed to the insertion hole;
   a second cylindrical conductive component arranged inside the cylindrical insulating component, where an upper surface of the second cylindrical conductive component being in contact with a lower surface of the large diameter portion of the first cylindrical conductive component; and
   a third cylindrical conductive component connected to the small diameter portion of the first cylindrical conductive component, where an outer surface of the third cylindrical conductive component being in contact with the second cylindrical conductive component.

2. The electrostatic chuck according to claim 1, wherein a base end of the power feeding terminal is fixed to the first cylindrical conductive component, and a tip end of the power feeding terminal is bonded to the electrode of the placing table by a solder layer or a brazing material.

3. The electrostatic chuck according to claim 1, wherein a base end of the power feeding terminal is connected to an elastic body of a connector, and a tip end of the power feeding terminal touches the electrode of the placing table by elastic force of the elastic body.

4. The electrostatic chuck according to claim 1, wherein the concave portion of the placing table is arranged to be shifted from a center of the penetration hole of the base plate.

5. The electrostatic chuck according to claim 1, wherein the placing table is formed of ceramic.

6. The electrostatic chuck according to claim 1, further comprising a second cylindrical conductive component arranged inside the cylindrical insulating component, the second cylindrical conductive component connected to the first cylindrical conductive component.

7. A semiconductor-liquid crystal manufacturing apparatus, comprising:
   a chamber; and
   an electrostatic chuck attached to the chamber, wherein the electrostatic chuck includes,
      a base plate including a penetration hole,
      a cylindrical insulating component inserted in the penetration hole, the cylindrical insulating component including a protruding portion protruding from an upper end of the penetration hole,
      a placing table arranged on the base plate,
      a dent portion formed in a lower face of the placing table, the dent portion in which the protruding portion of the cylindrical insulating component is fitted,
      a concave portion formed in the dent portion of the placing table,
      an electrode formed in the concave portion of the placing table,
      a power feeding terminal arranged in an inner part of the cylindrical insulating component, the power feeding terminal connected to the electrode;
      a first cylindrical conductive component arranged inside the cylindrical insulating component, the first cylindrical conductive component comprising a small diameter portion and a large diameter portion arranged over the small diameter portion, where a diameter of the small diameter portion being smaller than a diameter of the large diameter portion, and an insertion hole is formed in the first cylindrical conductive component, where the power feeding terminal being inserted into and fixed to the insertion hole;
      a second cylindrical conductive component arranged inside the cylindrical insulating component, where an upper surface of the second cylindrical conductive component being in contact with a lower surface of the large diameter portion of the first cylindrical conductive component; and
      a third cylindrical conductive component connected to the small diameter portion of the first cylindrical conductive component, where an outer surface of the third cylindrical conductive component being in contact with the second cylindrical conductive component.

* * * * *